United States Patent
Cheah

(10) Patent No.: US 7,342,766 B2
(45) Date of Patent: Mar. 11, 2008

(54) ON-CHIP CAPACITOR

(75) Inventor: Chin B. Cheah, Kedah Darul Aman (MY)

(73) Assignee: Silterra Malaysia Sdn. Bhd., Kedah Darul Aman (MY)

( * ) Notice: Subject to any disclaimer, the term of this patent is extended or adjusted under 35 U.S.C. 154(b) by 205 days.

(21) Appl. No.: 11/242,058

(22) Filed: Oct. 4, 2005

(65) Prior Publication Data

US 2006/0081904 A1   Apr. 20, 2006

(30) Foreign Application Priority Data

Oct. 14, 2004 (MY) .............................. PI 20044235

(51) Int. Cl.
*H01G 4/228* (2006.01)
(52) U.S. Cl. ................. 361/306.3; 361/306.1; 361/311; 361/313; 361/523; 361/525; 361/302
(58) Field of Classification Search ............. 361/306.3, 361/321.1, 321.2, 311–313, 523–534, 306.1, 361/328–330, 302–305
See application file for complete search history.

(56) References Cited

U.S. PATENT DOCUMENTS

| 5,198,967 | A  | * | 3/1993  | Kuranuki et al. | ............ | 361/523   |
| 6,266,227 | B1 | * | 7/2001  | Konushi et al.  | ......... | 361/306.1 |
| 6,356,429 | B2 | * | 3/2002  | Hayashi         | ...................... | 361/303   |
| 7,126,809 | B2 | * | 10/2006 | Iioka et al.    | .............. | 361/306.3 |

* cited by examiner

*Primary Examiner*—Nguyen T. Ha
(74) *Attorney, Agent, or Firm*—Dickstein Shapiro LLP

(57) ABSTRACT

An on-chip capacitor having a plurality of capacitor layers. Each capacitor layer includes a pair of frames. A first frame of the pair is electrically connected to first frames on each other capacitor layer and a second frame of the pair is electrically connected to second frames on each other capacitor layer. A plurality of tines project from each frame within the respective capacitor layer. The tines from each frame mesh so as to form an array of sequentially alternating tines from each frame to provide a layer capacitance within the capacitor layer. The multi-layer capacitor further includes a plurality of projections from the tines. The projections extend between frames of adjacent capacitor layers so as to provide an interstitial capacitance between the capacitor layers. The total capacitance of the on-chip capacitor is the sum of each layer capacitance and each interstitial capacitance.

7 Claims, 5 Drawing Sheets

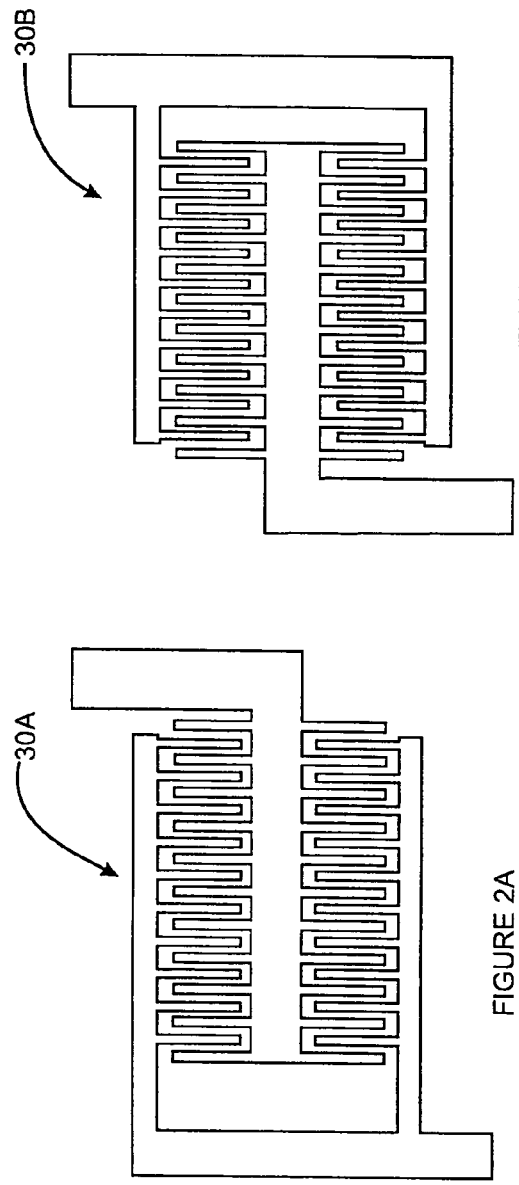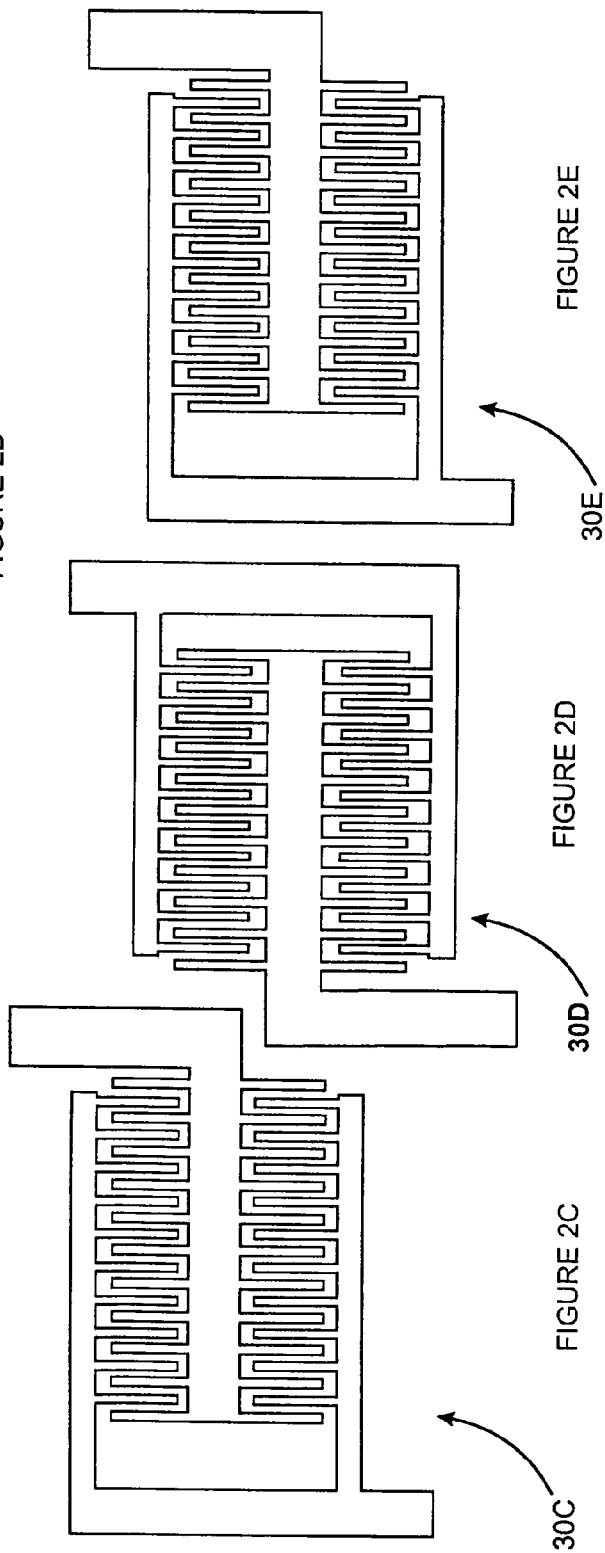

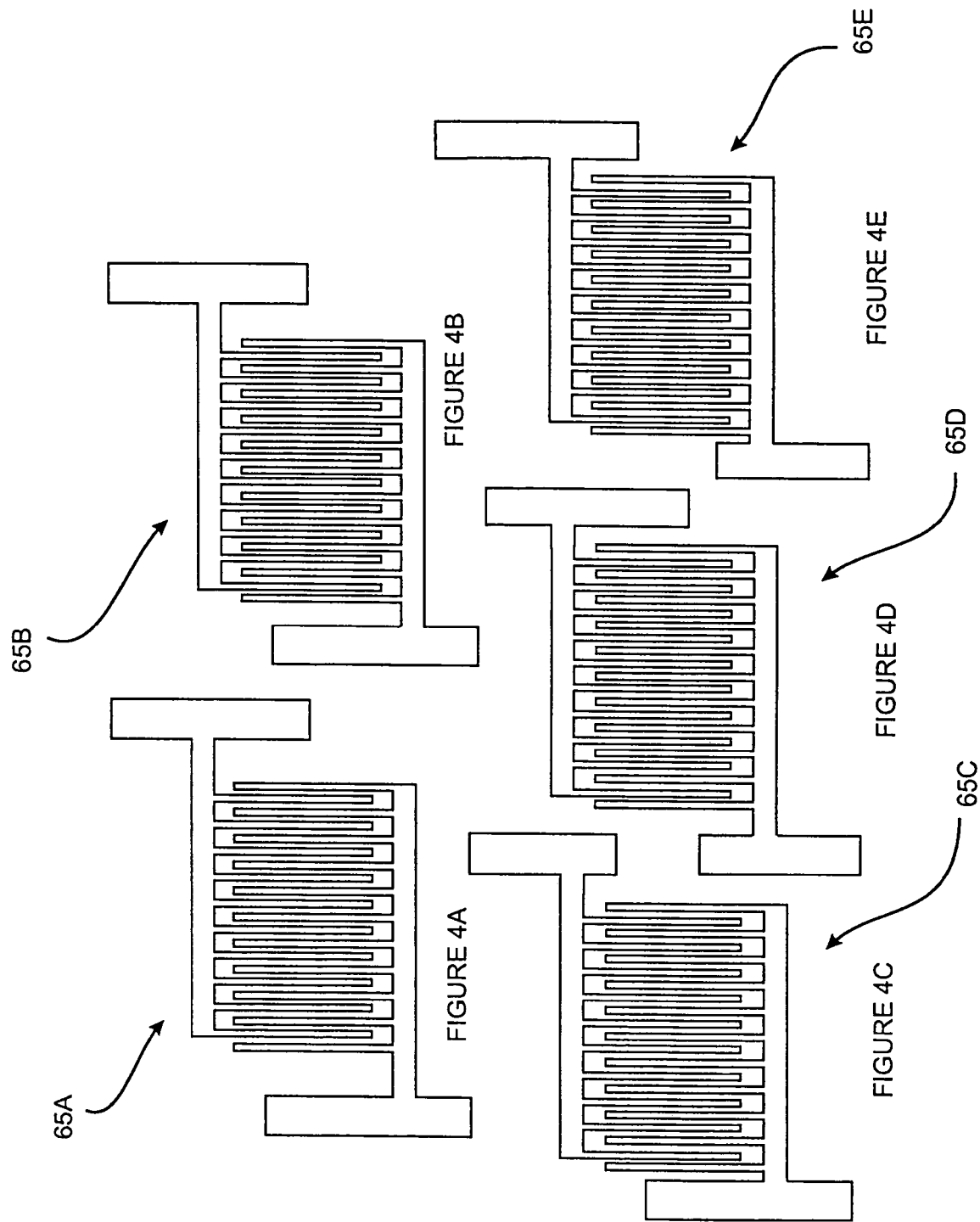

ON-CHIP CAPACITOR

FIELD OF THE INVENTION

The invention relates to integrated circuit structures in particular those structures relating to capacitors.

BACKGROUND OF THE INVENTION

MIM (Metal: Insulator: Metal) capacitors are known for their use in RF devices due to their high capacitance and low resistance.

A feature of the MIM capacitor is its multi-layer structure providing a further capacitance orthogonal to the plane of the layers.

An example of an MIM capacitor is the interdigitized form whereby tines of a first part of the capacitor intermesh with the tines of another providing a sequentially alternating array. Collectively, the array provides an increased capacitance as compared to a simple plate pair arrangement. This particular high density arrangement further enhances the capacitance of the device as compared to similarly sized devices.

Nevertheless, with increasing requirements for capacitance within the same or smaller components, it is necessary to provide a device with higher capacitance within at least the same package size.

SUMMARY OF INVENTION

In a first aspect, the present invention provides an on-chip capacitor having a plurality of layers. Each layer comprises a pair of frames, such that a first frame of the pair is electrically connected to first frames on each other layer and a second frame of the pair is electrically connected to second frames on each other layer. The device further comprises a plurality of tines projecting from each frame within the respective layer, the tines from each frame meshing so as to form an array of sequentially alternating tines to provide a layer capacitance within each layer, wherein the multi-layer capacitor further includes a plurality of projections from said tines, said projections extending between frames of adjacent layers so as to provide an interstitial capacitance between the layers, such that the total capacitance of the on-chip capacitor is the sum of each layer capacitance and each interstitial capacitance.

Thus, the invention having a similar structure to the prior art forgoes the benefit of a layer to layer capacitance in favor of increased capacitance between the projections within the interstitial space between the layers.

In a preferred embodiment, the density of projections may be such so as to emulate a curtain between the layers and so increase the surface area of the capacitance generating arrangement.

In a further preferred embodiment, the method of production of the on-chip capacitor may vary dependent upon a number of factors. One such factor may be the size of the package. For instance, for the 0.18 μm technology, local interconnect or via features may be preferred. Alternatively, for the 0.13 μm technology, trench dual damascene etching may be preferred.

DESCRIPTION OF PREFERRED EMBODIMENT

It will be convenient to further describe the present invention with respect to the accompanying drawings which illustrate a possible arrangement of the invention. Other arrangements of the invention are possible and consequently the particularity of the accompanying drawings is not to be understood as superseding the generality of the preceding description of the invention.

FIGS. 2A to 2E are multiple plan views of the layers of the MIM capacitor of FIG. 1A;

FIGS. 4A to 4E are multiple plan views of the layers of the capacitor according to the present invention;

Figure 1B:
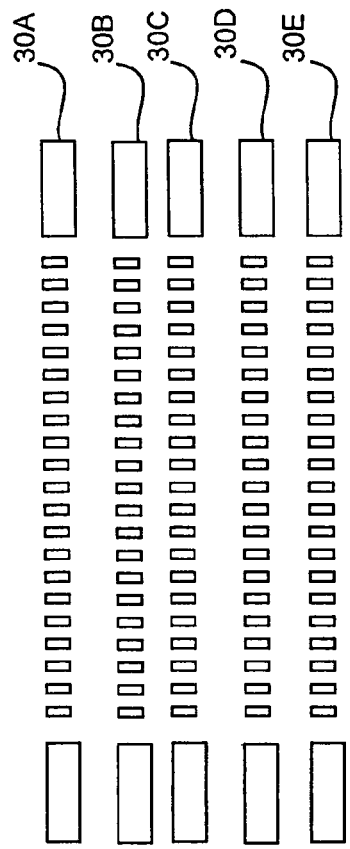
FIG. 1B is a side elevation view of the prior art of FIG. 1A.
Figure 1A:
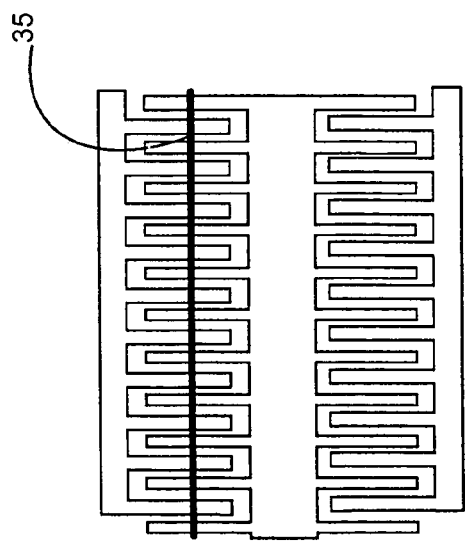
FIG. 1A is a detail view of a prior art MIM capacitor.
Figure 1D:
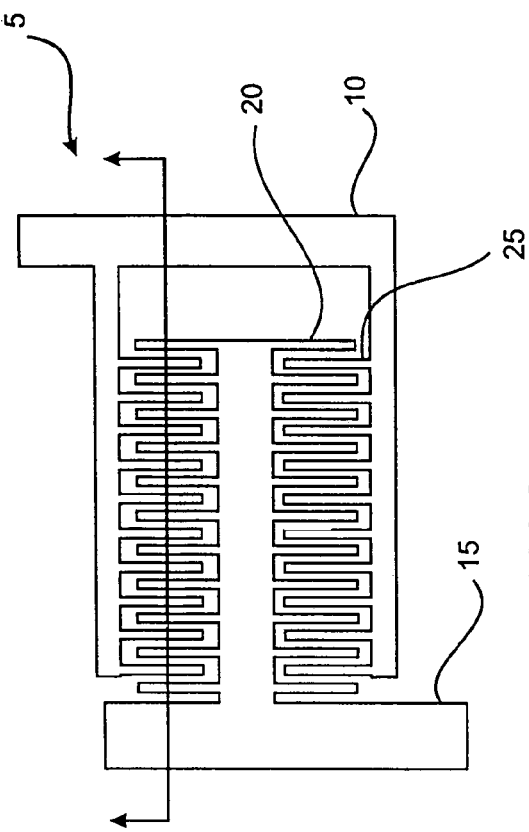
FIG. 1D is a plan view of the prior art of FIG. 1A.
Figure 1C:
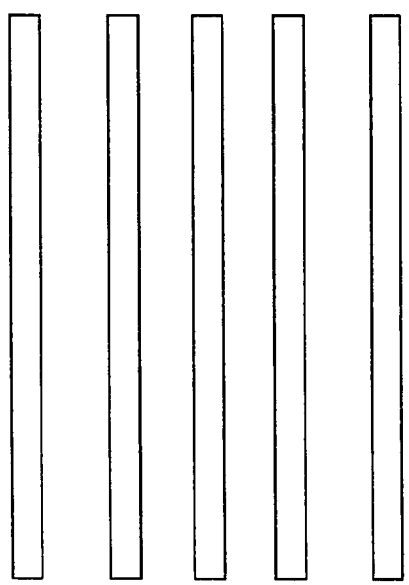
FIG. 1C is a front elevation of the prior art of FIG. 1A.
Figure 3A:
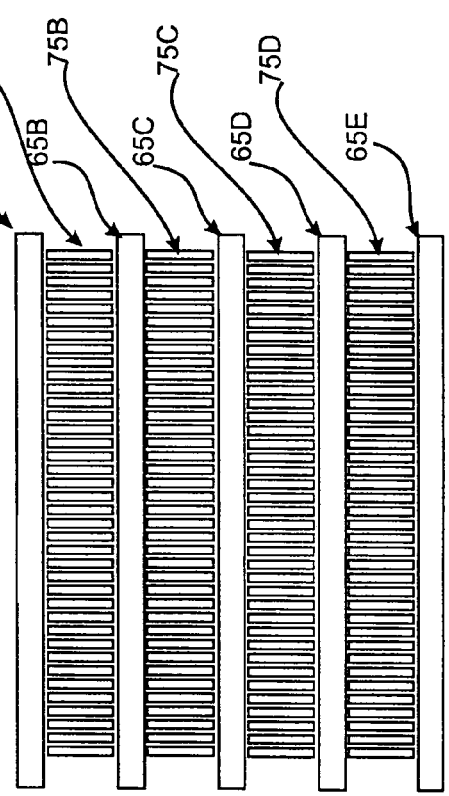
FIG. 3A is a plan view of a preferred embodiment according to the present invention.
Figure 3B:
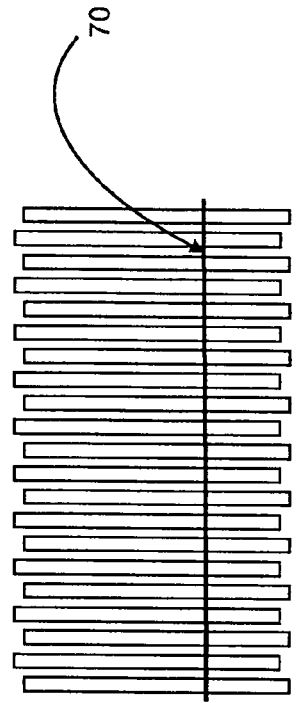
FIG. 3B is a side elevation of the capacitor of FIG. 3A.
Figure 3C:
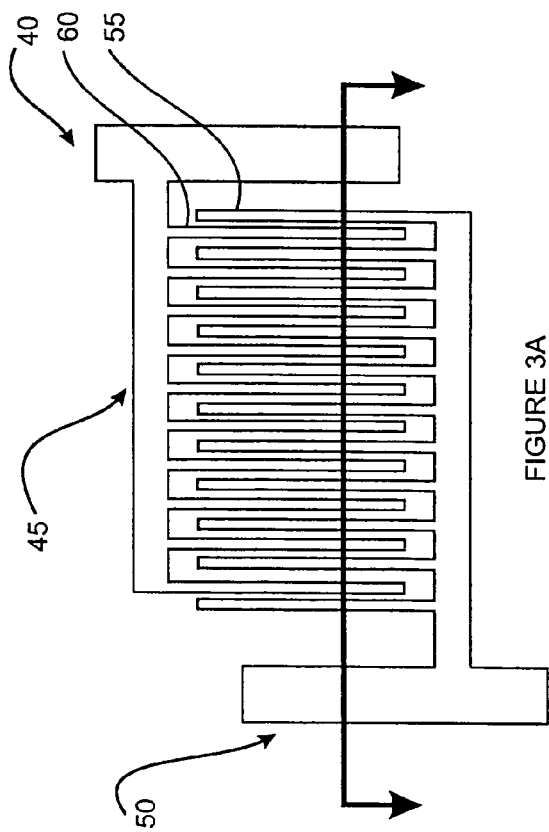
FIG. 3C is a front elevation of the capacitor of FIG. 3A.
Figure 3D:
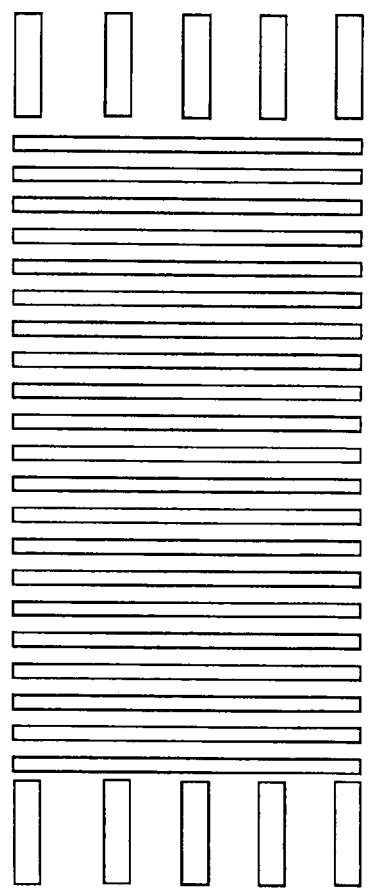
FIG. 3D is a detailed view of the capacitor of FIG. 3A.

FIGS. 1A to 1D show various views of a capacitor in particular, an MIM (Metal/Insulator/Metal) capacitor according to the prior art. Here is shown a capacitor 5 comprising two frames 10 and 15 having intermeshed tines 20 and 25. By passing a potential difference across frames 10 and 15, a capacitance is provided by the intermeshing of the tines 20 and 25 within the plane of the layer. In this case, the frames 10 and 15 are separated into an external frame 10 and an internal frame 15 whereby a projection of the internal frame lies within the external frame with intermeshing tines projecting outward from the internal projection and inward from the external projection. As a consequence, the capacitance is developed along an axis 35 within the plane of the layer. The prior art capacitor 5 in fact comprises five such layers 30A to 30E each having an arrangement of an external frame and an internal frame with intermeshing tines.

FIGS. 2A to 2E show plan views of the individual layers 30A to 30E of the prior art capacitor 5. In each case, there is one frame being placed external to an internal portion of a second frame. It will be noted that the internal and external arrangement alternates from layer to layer. In fact, the alternating internal and external frames are electrically connected such that on providing the potential difference across the frames, the plurality of the external frames within the capacitor 5 alternate per layer. This arrangement provides for a second capacitance to be developed between frames of adjacent layers which in this case will be directed along an axis orthogonal to the plane of the layers. Thus, the total capacitance of the prior art capacitor 5 will be the sum of the layer capacitance provided by each layer 30A to 30E and the frame capacitance developed between adjacent frames due to the alternating polarity of the frame arrangement.

FIGS. 3A to 3D show an MIM capacitor 40 according to an embodiment of the present invention. As with the prior art, the capacitor is multi layered 65A to 65E, each layer having two frames 45 and 50. Further, each frame has intermeshing tines 55 and 60 which when a potential difference is provided between the frames 45 and 50, develop a capacitance within the layer. The present invention incorporates several variations from the prior art by omitting the need for a capacitance between layers. By omitting this capacitance, an increased density of layer capacitance becomes possible as the internal and external arrangement of the frames, as is the case with the prior art, is not necessary and so space taken by an internal portion of the frame is not required. To this end, the intermeshing tines 55 and 60 can be of an extra length and therefore develop an increased capacitance within each layer for the same planar dimensions of the layer.

The most significant difference between the present invention and the prior art, however, is the inclusion of projections from the individual tines 55 and 60. These projections 75A to 75D extend from one layer to the adjacent layer and therefore connect each layer with a curtain of projections in a similar intermeshing arrangement as the tines within each layer. To this end, with each layer capacitance developing said capacitance along an axis 70, the provision of the projections 75A to 75D develop a further capacitance in the interstitial space between the layers along an axis parallel to the layer capacitance axis 35. Thus, whilst the layer capacitance acts across an axis 70 so too does the capacitance in the interstitial spaces based upon the projections extending in a direction of orthogonal to the direction of the tines 55 and 60.

FIGS. 4A to 4E show plan views of each layer of the capacitor 40 according to a preferred embodiment of the present invention. It can be seen that each layer 65A to 65E is for all intents and purposes identical, with like frames on each layer being electrically connected. To this end, unlike the prior art, adjacent layers have the same polarity and therefore, no frame capacitance is developed between layers. This is necessary so that projections from the tines of one layer 65 may connect directly to like tines of an adjacent layer 65B and so still maintain the electrical isolation of the two frames.

The construction of a capacitor according to the present invention may vary. In a preferred embodiment, the layers having the metal layer capacitors will be separated using a dielectric layer. It will be clear to the person skilled in the art that materials used for an MIM capacitor of the prior art are equally applicable to the arrangement of the present invention. Thus, the present invention is not restricted to any one arrangement of materials but may be constructed by any suitable combination of materials known to the skilled addressee.

As the projections from the tines may be significant, it will be necessary to follow a procedure which will achieve the ends required of the present invention. To this end, several techniques may be used, for instance, the generation of the projections may be incorporated by etching vias or using local interconnect features in order to connect and construct the layer capacitors. These will be particularly useful for capacitors constructed according to the 0.18 technology. Alternatively, a dual damascene process may be applied in order to achieve the tine/projection construction which may be more suitable to the 0.13 technology. The invention is not restricted to any particular type or types of construction process.

Figure 5A:
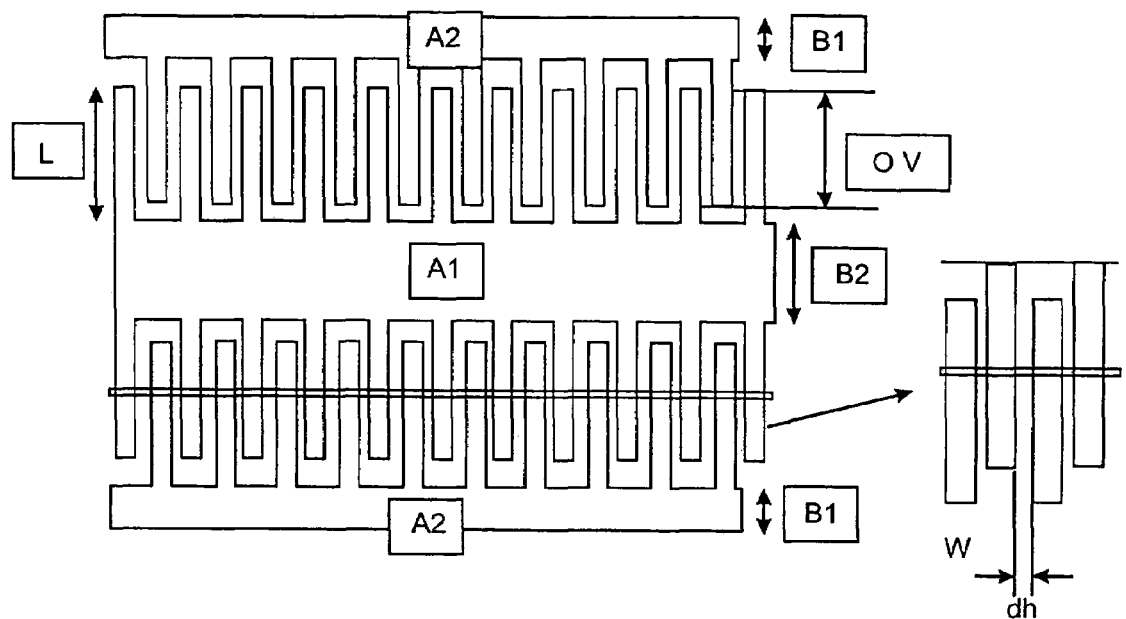
FIGS. 5A and 5B are schematic views of the active area of the prior art and of a preferred embodiment of the present invention.
Figure 5B:
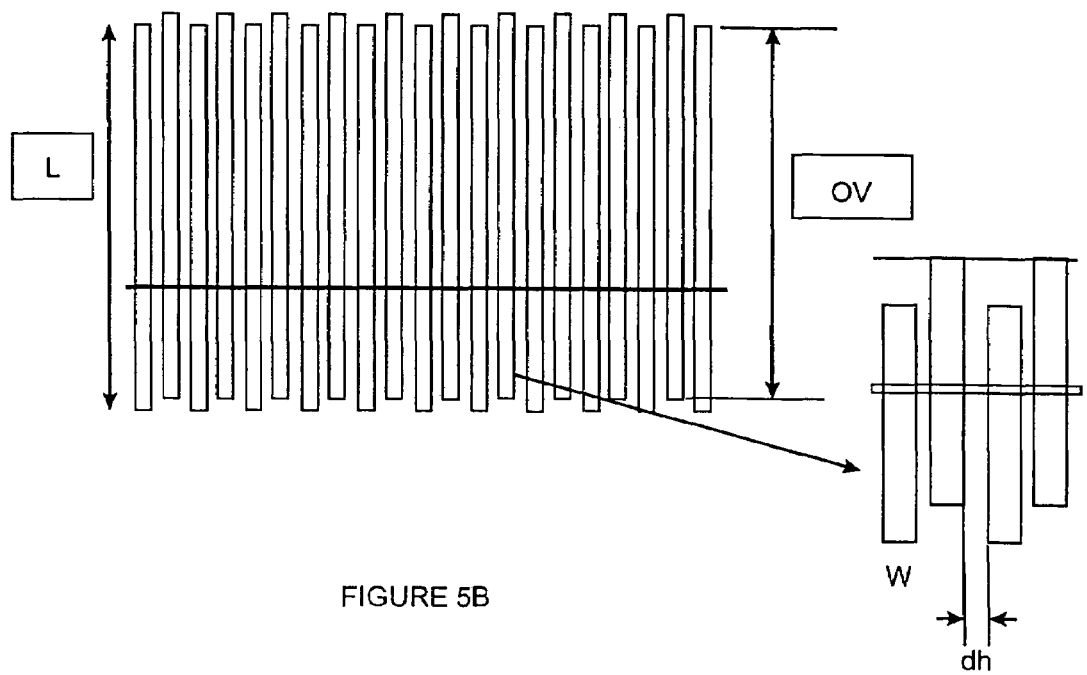

FIGS. 5A and 5B are detailed schematic views of the capacitors for both the prior art and the invention. The significance of the present invention over the prior art is an increased capacitance for no further processing steps or increase in overall dimensions of the capacitor when compared to the prior art. Tables 1 and 2 respectfully refer to the calculation of capacitance of FIG. 5A for the prior art and FIG. 5B for the present invention. The prior art capacitor provides a total capacitance of 381.258 E. By comparison, the present invention provides a capacitance of 371.428 Exfactor. For the via and local interconnect processes, the total capacitance is 650 E to 687.14 E. For the trench dual damascene process, the total capacitance is 835.713 E. It can be seen that subject to the process adopted that the increase in capacitance of the present invention over the prior art for this particular embodiment is of the order of 70 to 80% for a via or local interconnect construction and as high as 120% when a trench dual damascene process is used.

TABLE 1

| Symbol | Features | Specification |
|---|---|---|
| t | Metal thickness | 0.5 μm |
| w | metal width | 0.28 μm |
| dh | metal spacing | 0.28 μm |
| dv | lmd thickness | 0.7 μm |
| L | unit metal tine length | 0.5 μm |
| n | number of tines per unit capacitor cell | 20 |
| B1 | outer frame width | 1 μm |
| B2 | centre frame width | 2 μm |
| A1 | frame length | 12.32 μm |
| A2 | frame length outer | 11.2 μm |
| OV | tine overlap area | 0.4 μm |
| m | number of metal layer | 5 |
| ε | dielectric permitivity | |
| A | total area of parallel plate capacitor | |
| d | Distance of parallel plate capacitor | |

Original Interdigitated MIM Capacitor $C = C_{horizontal} + C_{vertical}$

| $C_{horizontal}$ | $C_{vertical}$ |
|---|---|
| $C_{horizontal} = E * A/d$ | $C_{vertical} = E * A/d$ |
| $C_{horizontal} = m * E * t * OV * n * 2/dh$ | $C_{vertical} = (m - 1) E * (A1B2 + A2B1 + 2(n + 1)w * L)/dv$ |
| $C_{horizontal} = 5 * E * 0.5 * 0.4 * 20 * 2/0.28$ | $C_{vertical} = (m - 1) E * (A1B2 + A2B1 + 2(n + 1)0.28 * 0.5)/0.7$ |
| $C_{horizontal} = 5 * E * 0.5 * 0.4 * 20 * 2/0.28$ | $C_{vertical} = (m - 1) E * (35.84 + 2(n + 1)0.14)/0.7$ |
| $C_{horizontal} = 40 * E/0.28$ | $C_{vertical} = 4E * (35.84 + 5.88)/0.7$ |
| $C_{horizontal} = 142.858 * E$ | $C_{vertical} = 238.4E$ |

TABLE 2

| Symbol | Features | Specification |
|---|---|---|
| t | Metal thickness | 0.5 μm |
| w | metal width | 0.28 μm |
| dh | metal spacing | 0.28 μm |
| dv | lmd thickness | 0.7 μm |
| L | unit metal tine length | 8 μm |
| n | Number of tines per unit capacitor cell | 20 |
| A1 | frame length | 12.82 μm |
| A2 | frame length outer | 11.2 μm |
| OV | tine overlap area | 2.6 μm |
| m | number of metal layer | 5 |
| ε | dielectric permitivity | |
| A | Total area of parallel plate capacitor | |
| d | Distance of parallel plate capacitor | |

| dielectric grade etch | design rules | Factor |
|---|---|---|
| Li | 0.26 * .82 | 0.6 |
| Li spacing | 0.26 | |
| Via | 0.26 | 0.6 |
| Via spacing | 0.26 | |
| dual damascene trench | | 1 |

Dielectric Metal Fill enhanced MIM Capacitor $C = C_{horizontal} + C_{vertical}$

| $C_{horizontal}$ | $C_{vertical}$ |
|---|---|
| $C_{horizontal} = E * A/d$ | $C_{vertical} = E * A/d$ |
| $C_{horizontal} = m * E * t * OV * n/dh$ | $C_{vertical} = (m - 1) E * t * OV * n * factor/dv$ |
| $C_{horizontal} = 5 * E * 0.5 * 2.6 * 20/0.28$ | $C_{vertical} = d * E * 0.5 * 2.6 * 20 * factor/0.28$ |
| $C_{horizontal} = 5 * E * 0.5 * 2.6 * 20/0.28$ | $C_{vertical} = 371.428 * E * factor$ |
| $C_{horizontal} = 464.285 * E$ | $C_{vertical} = 371.428 * factor * E$ |

TABLE 2-continued $C_{horizontal} = 464.285 * E$  $C_{vertical} = 371.428 * factor * E$
Factor for Via = 0.5
Factor for L1 = 0.6
Factor for Dual Damascene
Trench = 1

The invention claimed is:

1. An on-chip capacitor having a plurality of layers;
each capacitor layer comprising a pair of frames, such that a first frame of the pair is electrically connected to first frames on each other layer and a second frame of the pair is electrically connected to second frames on each other layer;
a plurality of tines projecting from each frame within the respective layer, the tines from each frame meshing so as to form an array of sequentially alternating tines to provide a layer capacitance within the layer, wherein the multi-layer capacitor further includes a plurality of projections from said tines, said projections extending between frames of adjacent layers so as to provide an interstitial capacitance between the layers, such that the total capacitance of the on-chip capacitor is the sum of each layer capacitance and each interstitial capacitance.

2. The on-chip capacitor according to claim 1 wherein the layers are substantially planar.

3. The on-chip capacitor according to claim 1 wherein the capacitor layers are separated by dielectric layers.

4. The on-chip capacitor according to claim 1 wherein metal used to form the capacitor is deposited using either or a combination of via an local interconnect processes.

5. The on-chip capacitor according to claim 1 wherein metal used to form the capacitor is deposited using a dual damascene process.

6. The on-chip capacitor according to claim 1 wherein the projections extend between each layer forming a curtain projecting orthogonally to the tines.

7. The on-chip capacitor according to claim 1 wherein the projections connect corresponding tines on adjacent layers.

* * * * *